(12) United States Patent
Swan et al.

(10) Patent No.: US 8,053,872 B1
(45) Date of Patent: Nov. 8, 2011

(54) INTEGRATED SHIELD FOR A NO-LEAD SEMICONDUCTOR DEVICE PACKAGE

(75) Inventors: Geoff Swan, High Point, NC (US);
Waite R. Warren, Jr., Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 11/768,014

(22) Filed: Jun. 25, 2007

(51) Int. Cl.
*H01L 23/28* (2006.01)
*H01L 23/552* (2006.01)
*H05K 9/00* (2006.01)
*C23C 18/16* (2006.01)
*C23C 18/32* (2006.01)

(52) U.S. Cl. ......... 257/659; 257/E23.114; 257/E23.062; 257/E21.001; 257/660; 257/678; 257/699; 257/684; 257/784; 257/786; 257/707; 257/704; 257/711

(58) Field of Classification Search .................. 257/659, 257/E23.114, E21.001, 784, 786, 707, 704, 257/711, E23.062, 660, 678, 699, 684
See application file for complete search history.

(56) References Cited

U.S. PATENT DOCUMENTS

| | | | |
|---|---|---|---|
| 3,566,190 A | 2/1971 | Brown | |
| 3,907,616 A | 9/1975 | Wiemer | |
| 4,680,676 A | 7/1987 | Petratos et al. | |
| 5,389,738 A | 2/1995 | Piosenka et al. | |
| 5,406,630 A | 4/1995 | Piosenka et al. | |
| 5,459,368 A | 10/1995 | Onishi et al. | |
| 5,473,512 A | 12/1995 | Degani et al. | |
| 5,639,989 A | 6/1997 | Higgins | |
| 5,646,828 A | 7/1997 | Degani et al. | |
| 5,650,659 A | 7/1997 | Mostafazadeh et al. | |
| 5,977,626 A * | 11/1999 | Wang et al. | 257/707 |
| 6,004,180 A * | 12/1999 | Knall et al. | 445/59 |
| 6,011,698 A | 1/2000 | Buehler | |
| 6,137,693 A | 10/2000 | Schwiebert et al. | |

(Continued)

FOREIGN PATENT DOCUMENTS

CN  1855451  11/2006

(Continued)

OTHER PUBLICATIONS

RF Micro Devices, Inc., "Fractional-N RF Synthesizer With Modulator and Digital IF Filter," RF6001, Rev A2, May 6, 2002, 2 pages.

(Continued)

*Primary Examiner* — Alexander O Williams
(74) *Attorney, Agent, or Firm* — Withrow & Terranova, P.L.L.C.

(57) ABSTRACT

The present invention integrates a shield on a flat, no-lead (FN) semiconductor package, which has multiple rows of contact pads along any side. The FN semiconductor package will have at least one inner row and one outer row of contact pads on at least one side. The inner and outer rows of contact pads and a die attach pad form the foundation for the FN semiconductor package. A die is mounted on the die attach pad and connected by wirebonds to certain contact pads of the inner rows of contact pads. An overmold body is formed over the die, die attach pad, wirebonds, and inner row of contact pads, and substantially encompasses each contact pad of the outer row of contact pads. A conformal coating is applied over the overmold body, including the exposed surfaces of the contact pads of the outer row of contact pads, providing a shield.

21 Claims, 11 Drawing Sheets

U.S. PATENT DOCUMENTS

| | | | |
|---|---|---|---|
| 6,150,193 A | 11/2000 | Glenn | |
| 6,163,454 A | 12/2000 | Strickler | |
| 6,448,583 B1 | 9/2001 | Yoneda et al. | |
| 6,297,957 B1 | 10/2001 | Johnson et al. | |
| 6,448,793 B1 | 9/2002 | Barratt et al. | |
| 6,466,416 B1 | 10/2002 | Honjo et al. | |
| 6,538,196 B1 | 3/2003 | MacDonald et al. | |
| 6,590,152 B1 | 7/2003 | Horio et al. | |
| 6,599,779 B2 * | 7/2003 | Shim et al. | 438/122 |
| 6,613,660 B2 | 9/2003 | Kahlert et al. | |
| 6,633,073 B2 | 10/2003 | Rezvani et al. | |
| 6,657,592 B2 | 12/2003 | Dening et al. | |
| 6,707,168 B1 * | 3/2004 | Hoffman et al. | 257/796 |
| 6,717,485 B2 | 4/2004 | Kolb et al. | |
| 6,791,795 B2 | 9/2004 | Ohtomo et al. | |
| 6,807,731 B2 | 10/2004 | Brandenburg et al. | |
| 6,825,560 B1 | 11/2004 | Walker et al. | |
| 6,838,750 B2 | 1/2005 | Nuytkens et al. | |
| 6,887,787 B2 | 5/2005 | Farnworth | |
| 6,946,324 B1 * | 9/2005 | McLellan et al. | 438/111 |
| 6,998,532 B2 | 2/2006 | Kawamoto et al. | |
| 7,030,469 B2 * | 4/2006 | Mahadevan et al. | 257/659 |
| 7,042,398 B2 | 5/2006 | Tang | |
| 7,087,461 B2 * | 8/2006 | Park et al. | 438/112 |
| 7,087,462 B1 * | 8/2006 | Park et al. | 438/112 |
| 7,109,817 B2 | 9/2006 | Kolb | |
| 7,125,744 B2 | 10/2006 | Takehara et al. | |
| 7,187,060 B2 | 3/2007 | Usui | |
| 7,227,719 B2 | 6/2007 | Sasaki et al. | |
| 7,259,041 B2 | 8/2007 | Stelzl et al. | |
| 7,342,303 B1 | 3/2008 | Berry et al. | |
| 7,348,663 B1 * | 3/2008 | Kirloskar et al. | 257/704 |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,598,606 B2 * | 10/2009 | Chow et al. | 257/686 |
| 7,633,170 B2 | 12/2009 | Yang et al. | |
| 7,635,918 B2 | 12/2009 | Yoshida | |
| 7,643,311 B2 | 1/2010 | Coffy | |
| 7,665,201 B2 | 2/2010 | Sjoedin | |
| 7,671,451 B2 * | 3/2010 | Lee et al. | 257/666 |
| 7,700,411 B2 | 4/2010 | Yang et al. | |
| 7,902,643 B2 | 3/2011 | Tuttle | |
| 7,928,538 B2 | 4/2011 | Salzman | |
| 2002/0036345 A1 | 3/2002 | Iseki et al. | |
| 2002/0118529 A1 | 8/2002 | Babin et al. | |
| 2003/0011049 A1 * | 1/2003 | Nuytkens et al. | 257/666 |
| 2003/0048581 A1 | 3/2003 | Ohtomo et al. | |
| 2003/0062541 A1 | 4/2003 | Warner | |
| 2004/0103509 A1 | 6/2004 | Bidard | |
| 2004/0104473 A1 | 6/2004 | Farnworth | |
| 2004/0178500 A1 | 9/2004 | Usui | |
| 2004/0209434 A1 | 10/2004 | Seaford et al. | |
| 2004/0214023 A1 | 10/2004 | Park et al. | |
| 2004/0232536 A1 * | 11/2004 | Fukuzumi | 257/684 |
| 2004/0238934 A1 * | 12/2004 | Warner et al. | 257/686 |
| 2005/0046001 A1 | 3/2005 | Warner | |
| 2005/0153061 A1 | 7/2005 | Nuytkens et al. | |
| 2006/0033184 A1 * | 2/2006 | Park et al. | 257/666 |
| 2006/0151203 A1 | 7/2006 | Krueger et al. | |
| 2006/0244131 A1 * | 11/2006 | Kobayashi et al. | 257/724 |
| 2006/0274517 A1 | 12/2006 | Coffy | |
| 2007/0030661 A1 | 2/2007 | Morris et al. | |
| 2007/0045248 A1 | 3/2007 | Schein et al. | |
| 2007/0062637 A1 | 3/2007 | Sjoedin | |
| 2007/0163802 A1 | 7/2007 | Monthei | |
| 2007/0200210 A1 * | 8/2007 | Zhao et al. | 257/676 |
| 2007/0290322 A1 * | 12/2007 | Zhao et al. | 257/690 |
| 2008/0019112 A1 * | 1/2008 | Hatanaka et al. | 361/814 |
| 2008/0054421 A1 * | 3/2008 | Dimaano et al. | 257/676 |
| 2008/0142938 A1 * | 6/2008 | Chow et al. | 257/676 |
| 2008/0157316 A1 | 7/2008 | Yang | |
| 2008/0210462 A1 | 9/2008 | Kawagishi et al. | |
| 2008/0224306 A1 | 9/2008 | Yang | |
| 2008/0308912 A1 * | 12/2008 | Cha et al. | 257/659 |
| 2009/0072364 A1 * | 3/2009 | Punzalan et al. | 257/676 |
| 2009/0140402 A1 * | 6/2009 | Ohtani | 257/675 |

FOREIGN PATENT DOCUMENTS

| | | | |
|---|---|---|---|
| EP | 1715520 A1 | | 10/2006 |
| EP | 1717857 A2 * | | 11/2006 |
| EP | 1764834 B1 | | 3/2009 |
| JP | 11-163583 | | 6/1999 |
| JP | 2004-207352 | | 7/2004 |
| JP | 2005-039007 | | 2/2005 |
| JP | 2005-109306 | * | 4/2005 |
| JP | 2005109306 A | | 4/2005 |
| JP | 2006-332255 | | 12/2006 |
| JP | 2007-311396 | | 11/2007 |
| KR | 2006113412 | | 2/2006 |
| WO | 0035085 A1 | | 6/2000 |
| WO | 03058812 A1 | | 7/2003 |
| WO | 2004019490 A1 | | 3/2004 |
| WO | 2004060034 A1 | | 7/2004 |
| WO | 2007060784 | | 5/2007 |
| WO | 2007132560 A1 | | 11/2007 |

OTHER PUBLICATIONS

International Search Report for PCT/US2008/068153, mailed Dec. 9, 2008.

Chomerics, "Cho-Shield Conductive Coatings," Chomerics.

English translation of JP 2005-109306 A to Takase et al., publication date Apr. 25, 2005. Translation available Sep. 20, 2010. Abstract previously submitted Apr. 30, 2009.

Non-final Office Action, mailed Dec. 15, 2010, from U.S. Appl. No. 11/952,592.

Final Office Action, mailed Dec. 23, 2010, from U.S. Appl. No. 11/952,634.

Final Office Action mailed Feb. 24, 2011 regarding U.S. Appl. No. 11/952,592.

Notice of Allowance mailed Mar. 3, 2011 regarding U.S. Appl. No. 11/952,634.

Nonfinal Office Action mailed May 10, 2011 regarding U.S. Appl. No. 11/952,513.

Nonfinal Office Action with Requirement for Restriction/Election mailed Jun. 13, 2011 regarding U.S. Appl. No. 11/952,634.

Nonfinal Office Action mailed Jun. 22, 2011 regarding U.S. Appl. No. 11/952,670.

Nonfinal Office Action mailed Jul. 28, 2011 regarding U.S. Appl. No. 11/952,617.

* cited by examiner

INTEGRATED SHIELD FOR A NO-LEAD SEMICONDUCTOR DEVICE PACKAGE

FIELD OF THE INVENTION

The present invention relates to no-lead semiconductor devices, and more particularly to providing an integrated shield to protect a no-lead semiconductor device from electromagnetic interference (EMI).

BACKGROUND OF THE INVENTION

Electronic components have become ubiquitous in modern society. The electronics industry proudly, but routinely, announces accelerated clocking and transmission speeds and smaller integrated circuit modules. While the benefits of these devices are myriad, smaller and faster electronic devices create problems. In particular, high operating frequencies inherently require fast transitions between signal levels. Fast transitions between signal levels create electromagnetic emissions throughout the electromagnetic spectrum. Such emissions are regulated by the Federal Communications Commission (FCC) and other regulatory agencies. These electromagnetic emissions radiate from a source and may impinge upon other electronic components. If the signal strength of emissions at the impinged upon electronic component is high enough, the emissions may interfere with the operation of the impinged upon electronic component. This phenomenon is sometimes called electromagnetic interference (EMI) or crosstalk.

One way to reduce EMI is to shield the semiconductor device packages that cause EMI or are sensitive to EMI. Typically the shield is formed from a separate metal "can" that is placed over and effectively surrounds the semiconductor device package. The can is generally grounded. When electromagnetic emissions from within the semiconductor device package strike the interior surface of the can, the electromagnetic emissions are electrically shorted through the grounded can, thereby reducing emissions. Likewise, when emissions from another radiating element strike the exterior surface of the can, a similar electrical short occurs, and the semiconductor device package does not suffer EMI from other semiconductor device packages. Unfortunately, employing a separate can or like metal enclosure to cover a semiconductor device package adds complexity and cost to the fabrication process, which requires making, mounting, and grounding the can. Further, the use of cans requires extra space around the semiconductor device package for mounting, thus wasting precious real estate.

As such, there is a need for an electromagnetic shield that is inexpensive to manufacture on a large scale, does not waste space around the semiconductor device package, and effectively deals with EMI concerns.

SUMMARY OF THE INVENTION

The present invention integrates a shield on a flat, no-lead (FN) semiconductor device package, which has multiple rows of contact pads along any given side. As such, the FN semiconductor device package will have at least one inner row of contact pads and an outer row of contact pads on at least one side. The inner and outer rows of contact pads and a die attach pad form the foundation for the FN semiconductor device package. A die is mounted on the die attach pad and connected by wirebonds to certain contact pads of the inner rows of contact pads. An overmold body is formed over the die, the die attach pad, the wirebonds, and the inner row of contact pads. The overmold also substantially encompasses each of the contact pads of the outer row of contact pads. The bottom surfaces of the contact pads for the inner and outer rows are exposed on a bottom surface of the FN semiconductor device package. Further, at least an upper surface of some, if not all, of the contact pads of the outer row of contact pads is exposed after the overmold is in place. A conformal coating is applied substantially over the upper surfaces of the overmold body as well as the exposed upper surfaces of the contact pads of the outer row of contact pads to provide an integrated shield. An upper surface of a contact pad or the FN semiconductor device package may include one or more side and top surfaces of the contact pad or FN semiconductor device package, respectively.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
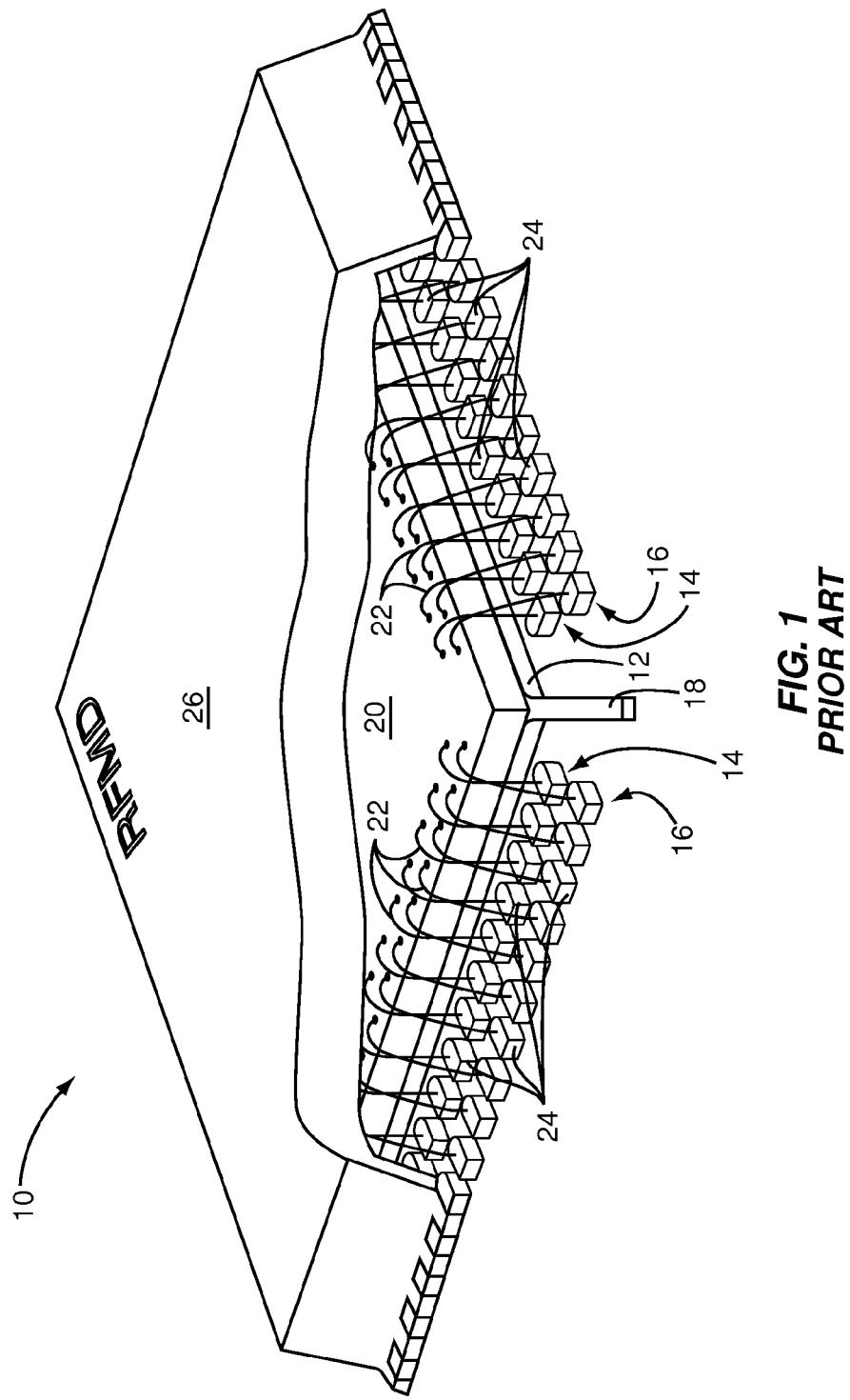
FIG. 1 depicts a perspective view of a dual row quad flat no-lead (QFN) semiconductor device package.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims. Further, the elements in the drawing figures included herewith are not to scale.

The present invention relates to a manufacturing process for an individual semiconductor device package having an integrated electromagnetic shield. The present invention may be applied to any no-lead multiple row semiconductor device package. In this exemplary embodiment, the present invention will be discussed as it relates to a dual row quad flat no-lead (QFN) semiconductor device package; however, those skilled in the art will recognize that the present invention may be applied to semiconductor device packages having three or more rows or any number of sides.

The present invention integrates a shield on a flat, no-lead (FN) semiconductor device package, which has multiple rows of contact pads along any given side. As such, the FN semiconductor device package will have at least one inner row of contact pads and an outer row of contact pads on at least one side. The inner and outer rows of contact pads and a die attach pad form the foundation for the FN semiconductor device package. A die is mounted on the die attach pad and connected by wirebonds to certain contact pads of the inner rows of contact pads. An overmold body is formed over the die, the die attach pad, the wirebonds, and the inner row of contact pads. The overmold also substantially encompasses each of the contact pads of the outer row of contact pads. The bottom surfaces of the contact pads for the inner and outer rows are exposed on a bottom surface of the FN semiconductor device package. Further, at least an upper surface of some, if not all, of the contact pads of the outer row of contact pads is exposed after the overmold is in place. A conformal coating is applied substantially over the upper surfaces of the overmold body as well as the exposed upper surfaces of the contact pads of the outer row of contact pads to provide an integrated shield. An upper surface of a contact pad or the FN semiconductor device package may include one or more side and top surfaces of the contact pad or FN semiconductor device package, respectively.

Prior to delving into the details of the present invention, an overview of a typical semiconductor device package that would benefit from shielding is described. With reference to FIG. 1, a perspective view of a common semiconductor device package 10 is shown. In particular, a dual row quad (four sided) flat no-lead (QFN) semiconductor device package 10 is illustrated. The semiconductor device package 10 is fabricated on a lead frame that provides a die attach pad 12, an inside row of contact pads 14, and an outside row of contact pads 16. Tie bars 18 located in each corner of the die attach pad 12 are used to help secure the lead frame strip in place. A die 20 resides on top of the die attach pad 12. Wire bonds 22 couple bond pads (not shown) from various devices on the die 20 to contact pads 24 within the inside row of contact pads 14 and the outside row of contact pads 16. An overmold body 26 is formed over the semiconductor device package 10, covering the die 20, die attach pad 12, wire bonds 22, inside row of contact pads 14 and a portion of the outside row of contact pads 16. As illustrated, a portion of the outside row of contact pads 16 remains exposed. The die attach pad 12, the inside row of contact pads 14, and the outside row of contact pads 16 are held together by the overmold body 26.

Figure 2:
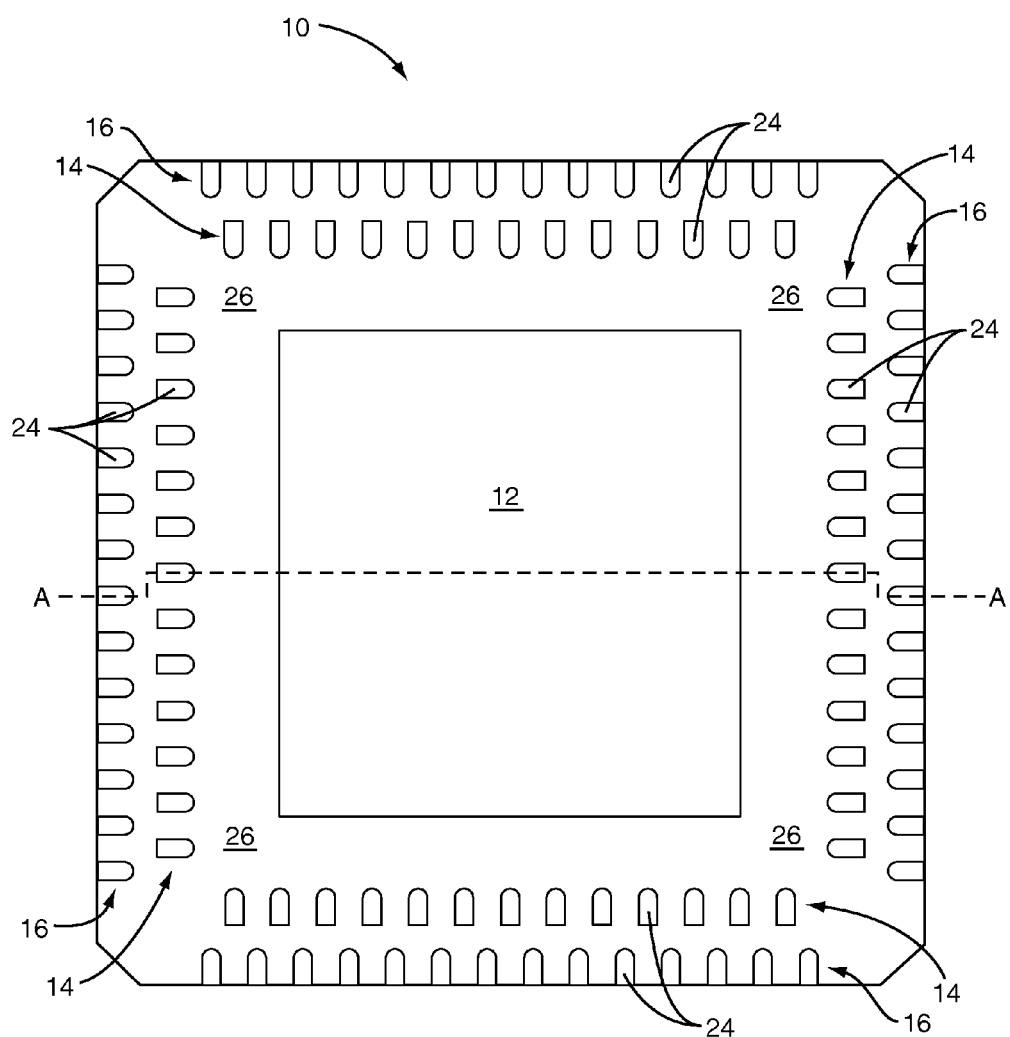
FIG. 2 depicts a bottom view of the dual row QFN semiconductor device package.
Figure 3:
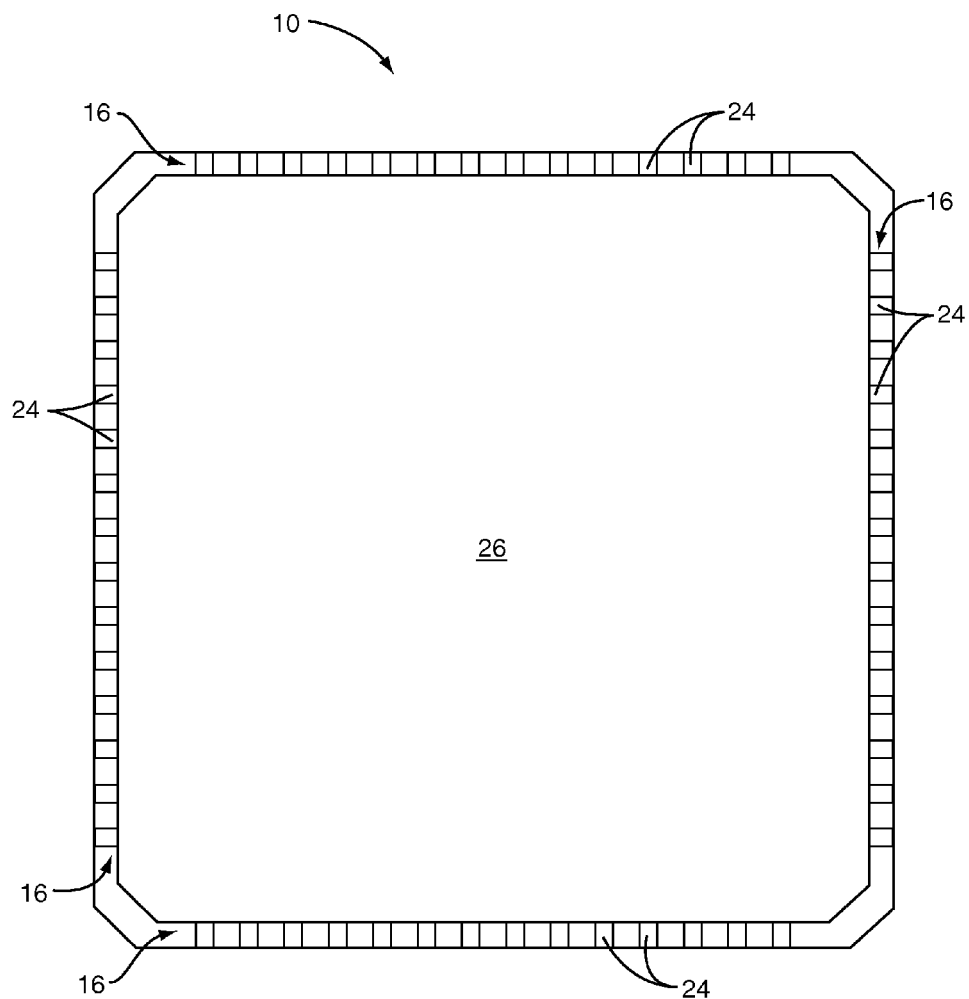
FIG. 3 depicts a top view of the dual row QFN semiconductor device package.

With reference to FIG. 2, a bottom view of the aforementioned semiconductor device package 10 is illustrated. Notably, a bottom surface of each of the contact pads 24 of the inside row of contact pads 14 and part of the outside row of contact pads 16 are exposed. Part of the bottom surface of the die attach pad 12 is also exposed. With reference to FIG. 3, a top view of the dual row QFN semiconductor device package 10 is illustrated. The overmold body 26 covers the semiconductor device package 10, leaving an outer portion of the top surface of the contact pads 24 of the outside row of contact pads 16 exposed. Additionally, or alternatively, the outer side surfaces of the contact pads 24 of the outside row of contact pads 16 may also be exposed.

Figure 4:
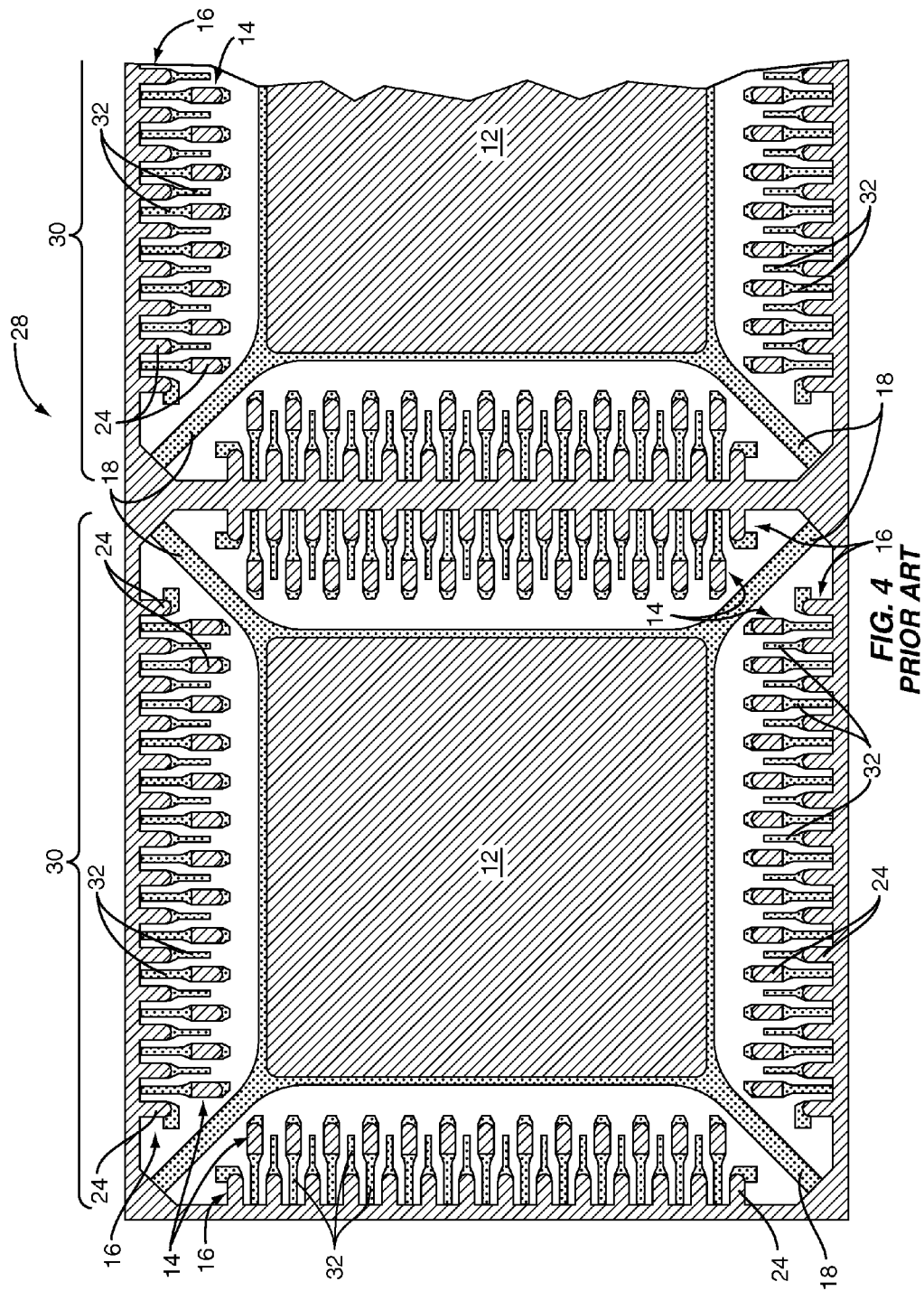
FIG. 4 depicts a top view of the dual row QFN semiconductor device package prior to die placement, wire bonding, and overmold deposition, where the inside contact pads, outside contact pads and die attach pad are all part of a lead frame strip.

FIG. 4 illustrates the bottom of a lead frame strip 28 that provides a plurality of leadframes 30 on which QFN semiconductor device packages 10 (not shown) are fabricated. The lead frame strip 28 may be formed of any metal, such as copper. In one embodiment, the lead frame strip 28 is plated with silver. In another embodiment, the lead frame strip 28 is first plated with nickel palladium and then plated with gold. The lead frame strip 28 effectively holds the contact pads 24 of the inside row of contact pads 14 and the outside row of contact pads 16 as well as the die attach pad 12 in place during most of the fabrication process. Attachment arms 32 connect the contact pads 24 of the inside row of contact pads 14 to the lead frame strip 28. The contact pads 24 of the outside row of contact pads 16 may directly attach to the lead frame strip 28. Tie bars 18 connect the die attach pad 12 to the lead frame strip 28.

Notably, all or a portion of each contact pad 24, attachment arm 32, tie bar 18, and die attach pad 12 may be half-etched. Half etching is a process to remove a bottom portion of all or part of a lead frame element to effectively reduce the thickness of the lead frame element relative to the rest of the lead frame 30 or lead frame strip 28. By removing a bottom portion of the lead frame element, that portion of the lead frame 30 that is half etched will not be flush with the bottom surface of the lead frame element or other lead frame elements that are not half etched. As such, the bottom surface of half-etched lead frame elements or portions thereof that are half-etched will not be exposed on the bottom surface of the semiconductor device package 10 once the overmold body 26 is provided. After the overmold body 26 is in place, the semiconductor device package 10, including the lead frame elements embodied therein, is removed from the lead frame strip 28. The overmold body 26 will then hold the contact pads 24 and the die attach pad 12 in place. Those lead frame elements or portions thereof that are half-etched are represented with dots, while lead frame elements or portions thereof that are not half-etched are represented with cross-hatching. The lead frame strip 28 itself is generally not half-etched, and as such, is represented with cross-hatching. Those areas that do not have dots or cross-hatching are completely etched away.

Figure 5:
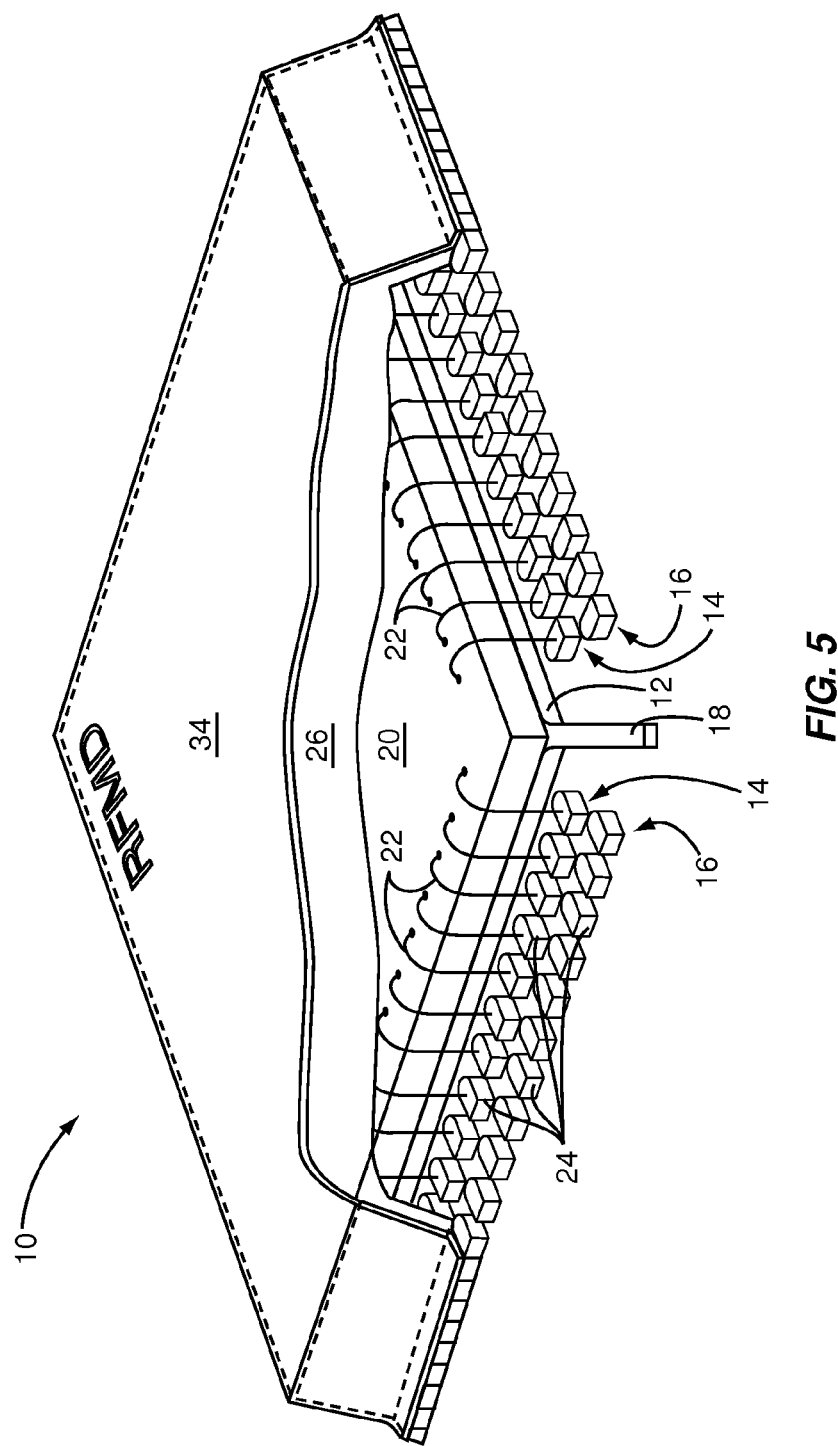
FIG. 5 depicts a perspective view of a dual row QFN semiconductor device package according to one embodiment of the present invention.

Turning now to FIG. 5, a perspective view of the dual row QFN semiconductor device package is illustrated according to one embodiment of the present invention. The semiconductor device package 10 is fabricated on a lead frame 30 (not shown) that provides a die attach pad 12, an inside row of contact pads 14, and an outside row of contact pads 16. Again, tie bars 18 located in each corner of the die attach pad 12 are used to help secure the lead frame strip 28 in place. A die 20 resides on top of the die attach pad 12. Wire bonds 22 couple bond pads (FIG. 4) from various devices on the die 20 to contact pads 24 within the inside row of contact pads 14 and the outside row of contact pads 16. An overmold body 26 is formed over the semiconductor device package 10, covering the die 20, die attach pad 12, wire bonds 22, inside row of contact pads 14 and a portion of the outside row of contact pads 16. As illustrated, a portion of the outside row of contact pads 16 remains exposed. The die attach pad 12, the inside row of contact pads 14, and the outside row of contact pads 16 are held together by the overmold body 26.

Figure 6:
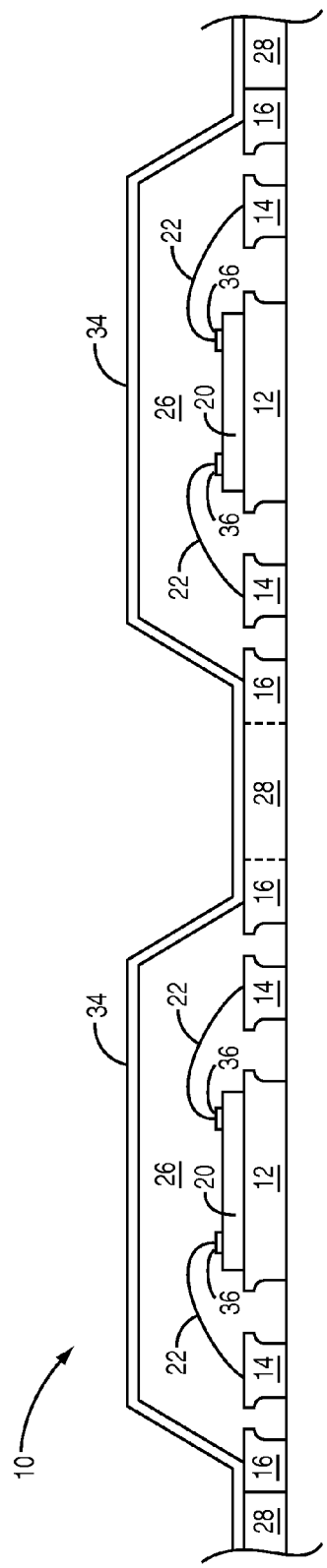
FIG. 6 depicts a cross-sectional view of the dual row QFN semiconductor device package after application of the shield.

For the present invention, a conformal coating is formed on the overmold body 26 and in contact with the exposed portion of the outside row of contact pads 16 to form an electromagnetic shield 34. The electromagnetic shield 34 reduces electromagnetic interference (EMI), especially when all or certain of the contact pads 24 of the outside row of contact pads 16 are grounded when the semiconductor device package is mounted on a module or like printed circuit board. In FIG. 6, a cross-sectional view of two semiconductor device packages 10 prior to singulation (or separation) are depicted according to the present invention.

In the following example, multiple semiconductor device packages 10 are formed, while only two are depicted. Each semiconductor device package 10 has an electromagnetic shield 34, according to one embodiment of the present invention. With reference to the graphical representations of FIGS. 7 through 14, a manufacturing process for creating the semiconductor device packages 10 with an electromagnetic shield 34 is provided. The cross-sections of the two semiconductor device packages 10 illustrated in FIGS. 7 through 13 correspond to cross section line A of FIG. 2.

Figure 7:
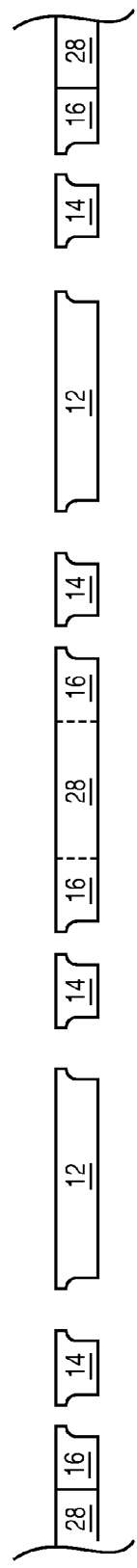
FIGS. 7-14 depict the process of manufacturing the dual row QFN semiconductor device package with a shield according to one embodiment of the present invention.

In FIG. 7, the manufacturing process begins by providing a lead frame strip 28 supporting the die attach pad 12, the inside row of contact pads 14, and the outside row of contact pads 16. The die attach pad 12 is connected to the lead frame strip 28 by the half-etched tie bars 18 (not shown) and the inside row of contact pads 14 are connected to the lead frame strip 28 by the half-etched attachment arms 32 (not shown). The outside row of contact pads 16 may be substantially directly connected to the lead frame strip 28, as depicted.

Figure 8:
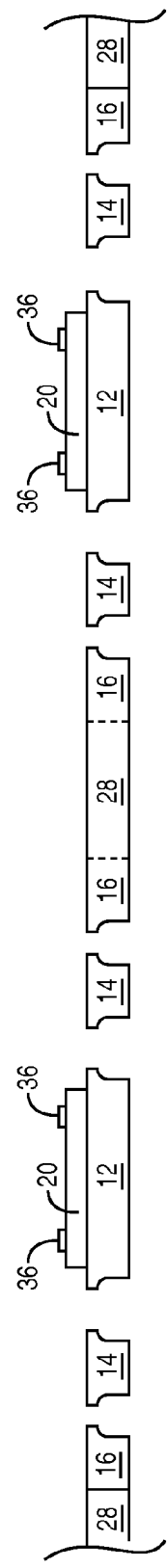
Figure 9:
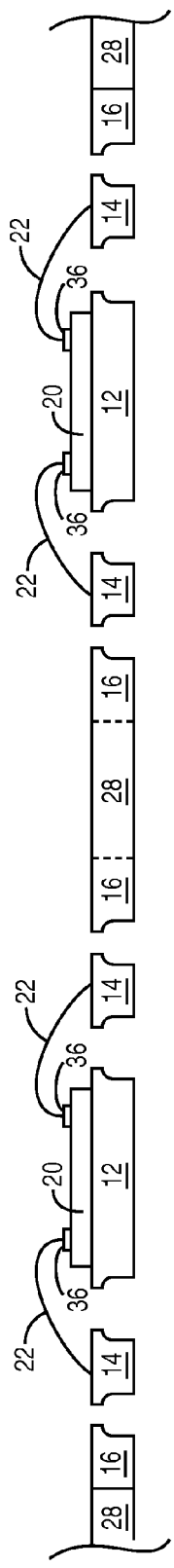

In FIG. 8, the die 20 is attached to the die attach pad 12 with a die attach material which may be an epoxy, solder, or the like. Bond pads 36, which are located on the die 20, provide for input or output (I/O) connections for the circuitry implemented on the die 20. In FIG. 9, wire bonds 22 are used to couple the bond pads 36 to appropriate contact pads 24 of the inside row of contact pads 14. These wire bonds may be gold, copper, aluminum, or the like. Notably, the wire bonds 22 are only coupled to the inside row of contact pads 14. All or most of the contact pads 24 of the outside row of contact pads 16 are reserved for connecting to the shield 34 and should not be used for any other purpose.

Figure 10:
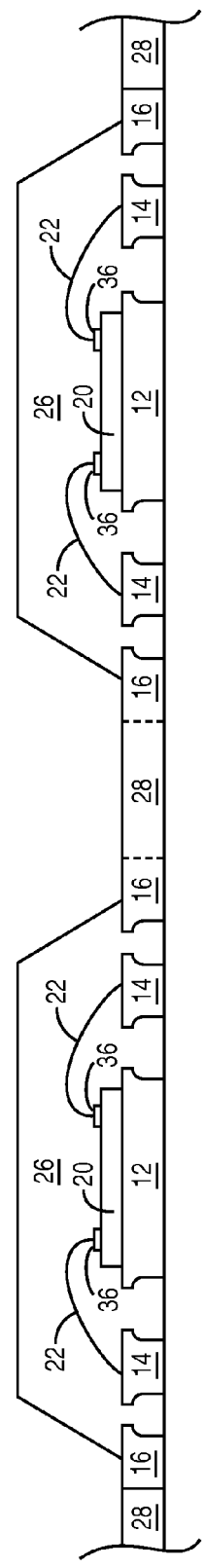

In FIG. 10, an overmold body 26 is formed over the lead frame strip 28 to encompass the die attach pad 12, the die 20, the bond pads 36, the wire bonds 22, the inside row of contact pads 14, and a portion of the outside row of contact pads 16. Notably, an upper surface of an outside portion of the contact pads 24 of the outside row of contact pads 16 remains exposed in order to make contact with the subsequently formed shield 34.

Figure 11:
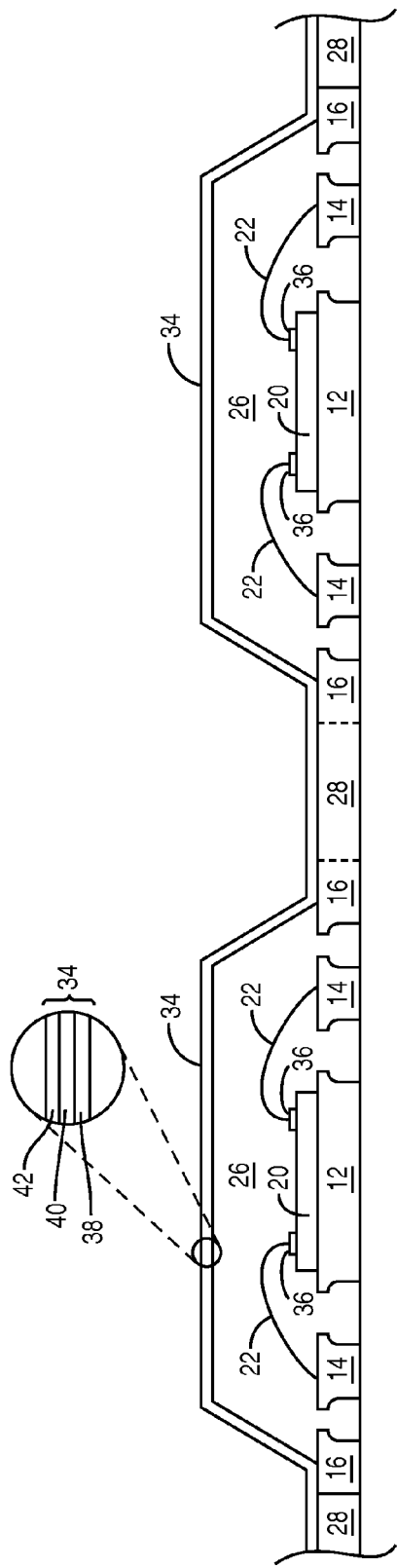

In FIG. 11, the overmold body 26 of the semiconductor device packages 10 may be roughened through an abrasion process, a desmear technique, or other process. In one embodiment, after roughening, an electroless plating mechanical or chemical process is performed to deposit a seed layer 38 of a conductive material on top of the overmold body 26 of the semiconductor device packages 10 and in contact with the outside row of contact pads 16. In an exemplary embodiment, the seed layer 38 of conductive material may be Copper (Cu), Aluminum (Al), Silver (Ag), Gold (Au), or other material as needed or desired. An electroless plating process is defined herein to be a chemical deposition of metal instead of electrical based deposition.

An exemplary electroless plating process of copper (Cu) on a dielectric substrate requires the prior deposition of a catalyst such as a palladium-tin (Pd—Sn) colloid consisting of a metallic Pd core surrounded by a stabilizing layer of Sn ions. The activation step (deposition of the colloid) is usually followed by an acceleration step (removal of excess ionic tin). Adhesion of the deposit to the substrate is improved by mechanical and chemical pretreatment steps. Other electroless plating processes could also be used and are considered within the scope of the present invention.

With continued reference to FIG. 11, after the seed layer 38 of conductive material is created over the overmold body 26 of the semiconductor device package 10 and in contact with the outside row of contact pads 16, an electrolytic plating process is performed to deposit a first layer 40 of conductive material on top of the initially deposited seed layer 38. In an exemplary embodiment, the first layer 40 of conductive material may be Cu, Al, Ag, Au, or other material as needed or desired. It should be appreciated that the outside row of contact pads 16 is electrically coupled to the seed layer 38, and the seed layer 38 then carries the current for the electrolytic plating process.

After the first layer 40 is generated, a second layer 42 is created on top of the first layer 40 through a second electrolytic plating process. The second layer 42 may be comparatively a poor conductor, and may be a layer of low stress nickel (Ni) or the like. Nickel serves to protect the conductive layers so that they do not tarnish, corrode, or otherwise suffer from environmental effects. Likewise, nickel may contribute to the shielding function by absorbing electromagnetic radiation. In an exemplary embodiment, the seed layer 38, the first layer 40, and the second layer 42 form the shield 34, which are approximately 15 μm thick in total. Greater or lesser thicknesses may also be generated. It should be appreciated that some steps may be added to, subtracted from, or rearranged in the present process.

Figure 12:
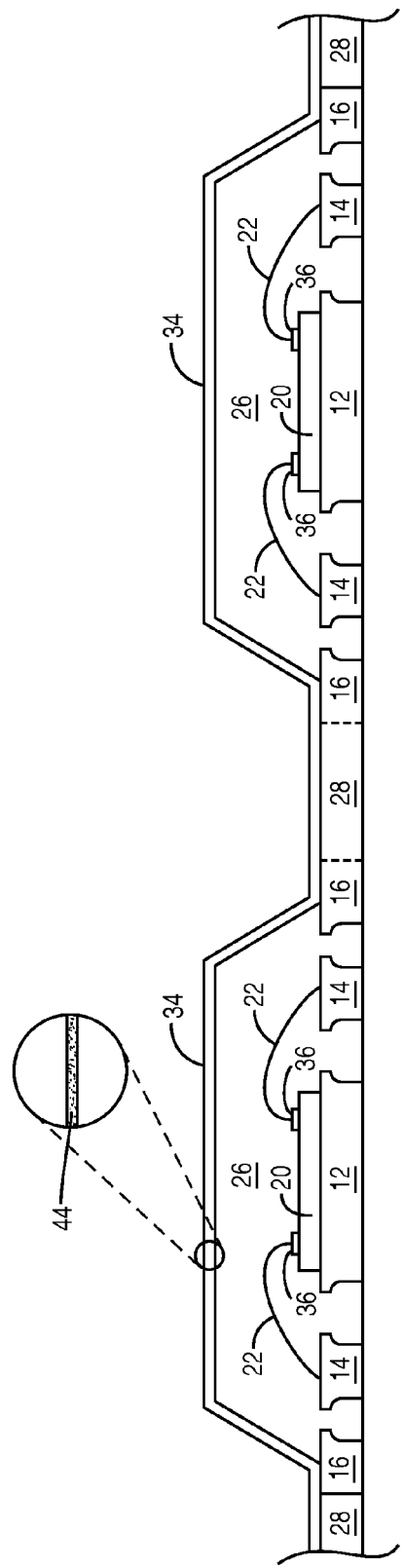

In FIG. 12, a second embodiment of the present invention is shown. After roughening, a conductive fleck-filled epoxy 44 is sprayed over the overmold body 26 of each of the semiconductor device packages 10 and in contact with the outside row of contact pads 16 of each of the semiconductor device packages 10 to form the shield 34. In an exemplary embodiment, the conductive fleck-filled epoxy 44 is CHO-SHIELD 610 sold by Chomerics of 77 Dragon Court, Woburn, Mass. 01801. The conductive flecks of the conductive fleck-filled epoxy 44 may be Cu, Ag, a mixture of Cu and Ag, a tin/zinc (Sn/Zn) alloy, or other conductive material as needed or desired.

Figure 13:
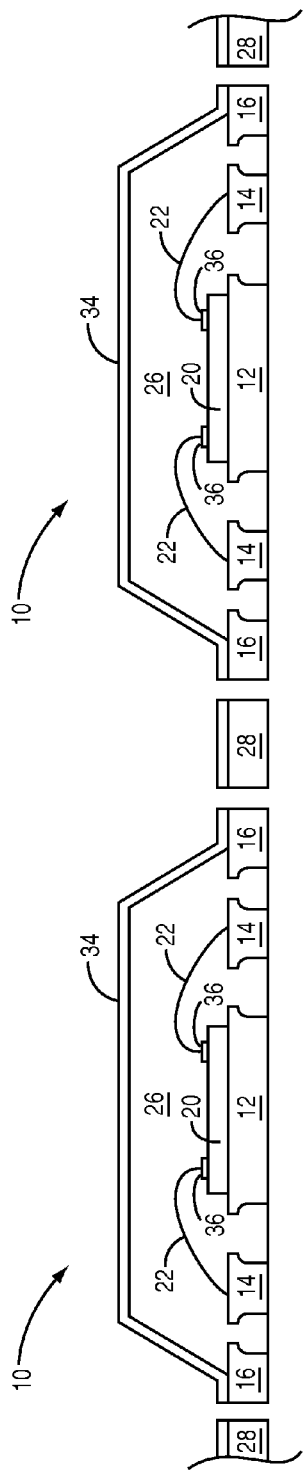

In FIG. 13, the lead frame strip 28 is singulated to separate the semiconductor device packages 10. As used herein, the term "singulation" is defined to be the process wherein the individual semiconductor device packages 10 are separated one from the other such that each semiconductor device package 10 is a single semiconductor device package 10. In a preferred embodiment, a punch singulation process is used.

Figure 14:
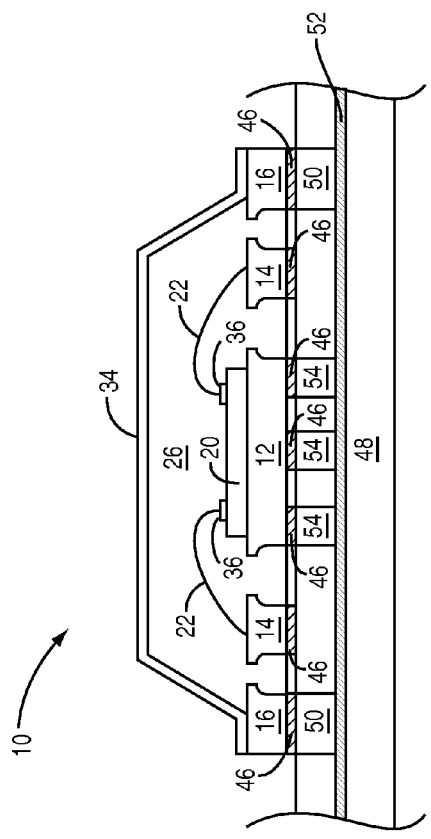

In FIG. 14, the semiconductor device package 10 is attached, with a bond material 46, to a substrate 48. The substrate 48 may be made up of several layers. Metallic coated or filled vias 50 may electrically couple the outside row of contact pads 16 to a ground (or other electrical potential) plane layer 52 within the substrate 48. As such, the shield 34 is electrically grounded through the outside row of contact pads 16. The shield 34, vias 50, and ground plane layer 52 may form a shielding structure, which substantially encompasses the semiconductor device package 10. Notably, vias 54 may electrically couple the die attach pad 12 to the ground plane layer 52.

Figure 15:
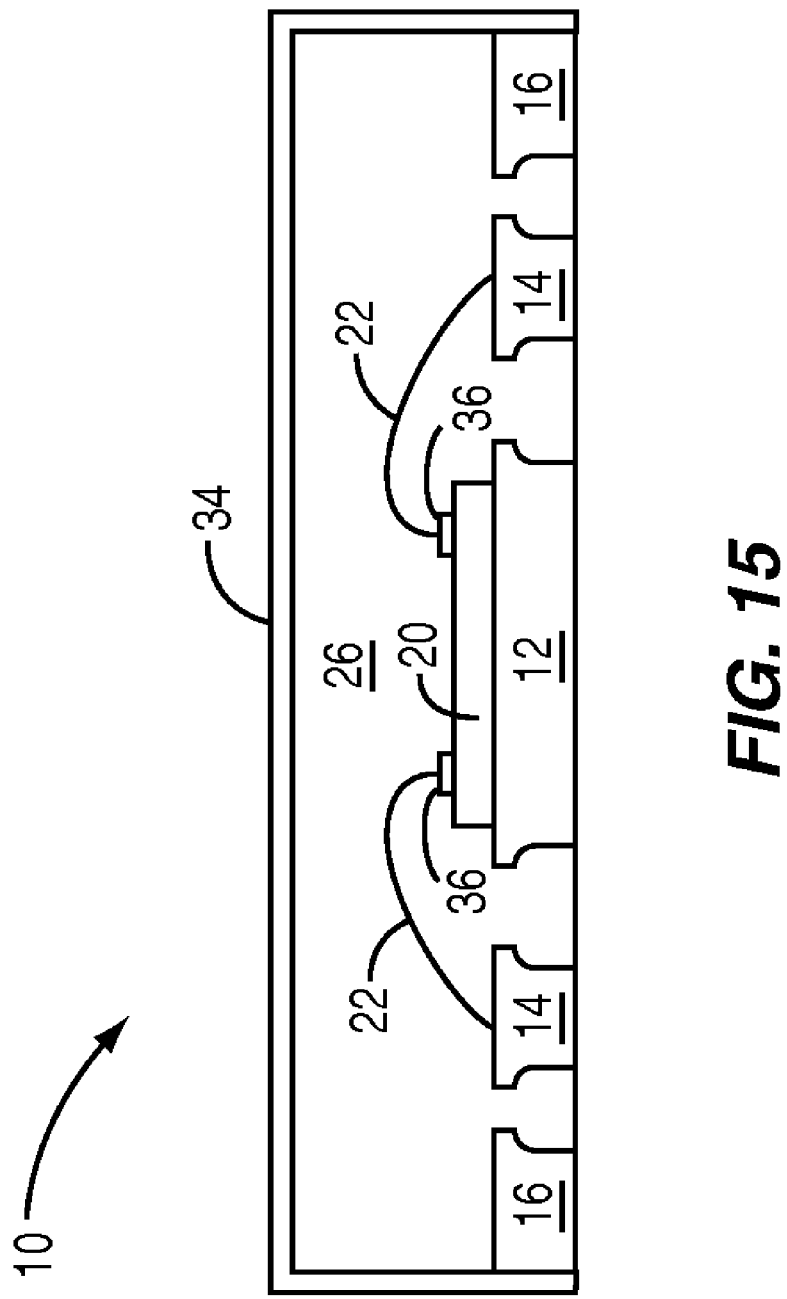
FIG. 15 depicts a cross-sectional view of the dual row QFN semiconductor device package with a shield according to an alternate embodiment of the present invention.

In FIG. 15, the semiconductor device package 10 according to an alternate embodiment of the present invention is shown. As depicted, the overmold body 26 is formed over the lead frame strip 28 to encompass the die attach pad 12, the die 20, the bond pads 36, the wire bonds 22, the inside row of contact pads 14, and an upper portion of the outside row of contact pads 16. If only an outer side surface of the contact pads 24 of the outside row of contact pads 16 is exposed, the shield 34 may simply be formed over the overmold body 26 and in contact with the outer side surface of the contact pads 24 of the outside row of contact pads 16.

Those skilled in the art will recognize improvements and modifications to the preferred embodiments of the present invention. All such improvements and modifications are considered within the scope of the concepts disclosed herein and the claims that follow.

What is claimed is:

1. A semiconductor device comprising:
   a lead frame comprising a die attach pad, an outside row of contact pads, and an inside row of contact pads between the die attach pad and the outside row of contact pads;
   a die on the die attach pad;
   a plurality of wire bonds coupling a plurality of bond pads on the die to a plurality of the inside row of contact pads;
   an overmold body covering the die attach pad, the die, the wire bonds, and the inside row of contact pads to form a semiconductor device package having an upper portion and a bottom surface, wherein at least an exposed portion of the outside row of contact pads is not covered by the overmold body; and
   a conformal coating substantially covering the upper portion of the semiconductor device package and in electrical contact with the exposed portion of at least a plurality of the outside row of contact pads.

2. The semiconductor device of claim 1 wherein the die attach pad, the die, the wire bonds, the inside row of contact pads, and the outside row of contact pads are held together by the overmold body.

3. The semiconductor device of claim 1 wherein a portion of the inside row of contact pads and a portion of the outside row of contact pads are exposed on the bottom surface of the semiconductor device package.

4. The semiconductor device of claim 1 wherein the conformal coating comprises:
   an electroless plated seed layer of conductive material disposed on the upper portion of the semiconductor device package and in electrical contact with the exposed portion of at least a plurality of the outside row of contact pads,
   an electrolytic plated conductive layer disposed on the electroless plated seed layer, and
   an electrolytic plated metallic layer disposed on the electrolytic plated conductive layer.

5. The semiconductor device of claim 1 wherein the conformal coating comprises a sprayed conductive material disposed on the upper portion of the semiconductor device package and in electrical contact with the exposed portion of at least a plurality of the outside row of contact pads.

6. The semiconductor device of claim 1 wherein the upper portion comprises a top surface and at least one side surface of the semiconductor device package.

7. The semiconductor device of claim 1 wherein the conformal coating is in contact with each of the outside row of contact pads.

8. The semiconductor device of claim 1 wherein the conformal coating is in contact with a majority of the outside row of contact pads.

9. The semiconductor device of claim 1 wherein the inside row of contact pads comprises a plurality of rows of contact pads.

10. The semiconductor device of claim 1 wherein the conformal coating contacts a top surface of the outside row of contact pads.

11. The semiconductor device of claim 1 wherein the conformal coating contacts an outer side surface of the outside row of contact pads.

12. The semiconductor device of claim 4 wherein the electroless plated seed layer of conductive material disposed on the upper portion of the semiconductor device package includes copper.

13. The semiconductor device of claim 4 wherein the electrolytic plated conductive layer disposed on the electroless plated seed layer includes copper.

14. The semiconductor device of claim 4 wherein the electrolytic plated metallic layer disposed on the electrolytic plated conductive layer includes nickel.

15. A semiconductor device comprising:
   a lead frame including a die attach pad, an inside row of contact pads, and an outside row of contact pads;
   a semiconductor die including a plurality of bond pads, the semiconductor die mounted on the die attach pad;
   a plurality of wire bonds coupled between the inside row of contact pads of the lead frame and the plurality of bond pads of the semiconductor die;
   an overmold body covering the die attach pad, the semiconductor die, the wire bonds, and the inside row of contact pads, and wherein at least a portion of the outside row of contact pads is an exposed portion and substantially uncovered by the overmold body, and wherein the overmold body includes an upper portion and a bottom portion;
   a multi-layer conformal coating substantially disposed upon and conformed to the upper portion of the overmold body, and at least a part of the exposed portion of the outside row of contact pads, wherein the multi-layer conformal coating forms a portion of an electromagnetic shield.

16. The semiconductor device of claim 15 wherein the multi-layer conformal coating includes an electroless plated seed layer of conductive material disposed on the upper portion of the semiconductor device package.

17. The semiconductor device of claim 16, wherein the electroless plated seed layer includes copper.

18. The semiconductor device of claim 16 wherein the multi-layer conformal coating further includes an electrolytic plated conductive layer disposed on the electroless plated seed layer.

19. The semiconductor device of claim 18 wherein the electrolytic plated conductive layer includes copper.

20. The semiconductor device of claim 18 wherein the multi-layer conformal coating further includes an electrolytic plated metallic layer disposed upon the electroless plated seed layer.

21. The semiconductor device of claim 20 wherein the electrolytic plated metallic layer includes nickel.

* * * * *